INVENTOR.
EMILE J. DAIGLE, JR.
BY John V. Regan
ATTORNEY

INVENTOR.
EMILE J. DAIGLE, JR.
BY John V. Regan
ATTORNEY

United States Patent Office 3,244,907
Patented Apr. 5, 1966

3,244,907
PULSE DELAY CIRCUITS
Emile J. Daigle, Jr., Palmyra, N.J., assignor to Radio Corporation of America, a corporation of Delaware
Filed Dec. 31, 1962, Ser. No. 248,558
7 Claims. (Cl. 307—88.5)

Figures 1, 2:
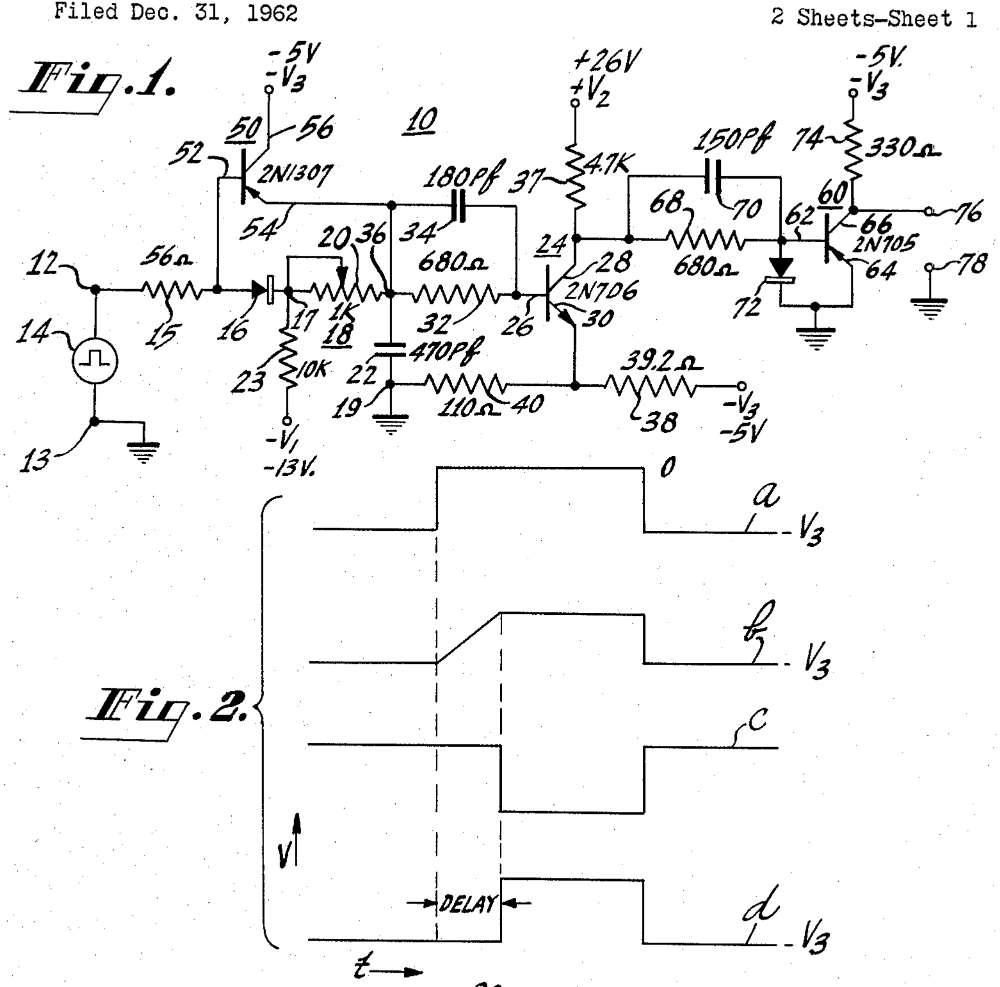
Figure 3:
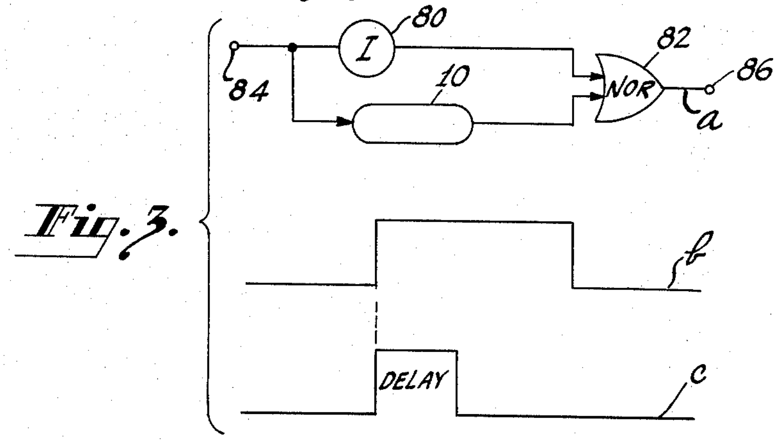

This invention relates to pulse circuits, and more particularly to pulse delay circuits.

Pulse delay circuits cause a predetermined time delay to be introduced between the application of an input pulse to the delay circuit and the derivation of an output pulse therefrom. Delay circuits may include delay lines, simulated or real, or pulse circuits. In the case of delay lines, the leading and lagging edges of an input pulse are equally delayed. In the case of pulse circuits, there may be a lag in the trailing edge only. It is frequently desirable to confine the delay to only the leading edge of the output pulse.

Accordingly, it is an object of this invention to provide an improved pulse delay circuit.

It is another object of this invention to provide a pulse delay circuit which delays only the leading edge of an output pulse.

Another object of the invention is to provide a novel pulse delay circuit arrangement for controlling the duration of an output pulse.

One example of a pulse delay circuit embodying the invention includes an integrating circuit comprising the series combination of a resistive element and a reactive storage element. A first transistor of one conductivity type has the base electrode thereof coupled to the junction of the integrating circuit. Means including said reactive storage element are provided to quiescently bias said first transistor to cut-off. The application of an input pulse of one polarity to the integrating circuit causes the reactive storage element to charge in a direction to turn on the first transistor. At a preselected point in the charge path, which point is determined by the time constant of the integrating circuit, the first transistor is forward biased to conduction and is driven rapidly to saturation. The first transistor thereby produces the leading edge of a pulse which is delayed a predetermined time from the leading edge of the input pulse. The time delay may be varied by varying the time constant of the integrating circuit. The lagging edge of the output pulse, however, is substantially coincident with the lagging edge of the input pulse. A second transistor, of opposite conductivity type to said first transistor, is provided in the delay circuit to assure the prompt discharge of the reactive storage element and turn off the first transistor at the termination of the input pulse.

Thus, a pulse delay circuit is provided which produces an output pulse having only the leading edge thereof delayed with respect to the leading edge of an input pulse. The delay of the leading edge of the output pulse may be varied by varying the time constant of the integrating circuit such as by making the resistive element thereof variable.

Accordingly, it is a further object of this invention to provide a leading edge delay circuit which may be varied to introduce different predetermined time delays between the leading edges of an input pulse and an output pulse.

The novel features which are considered to be characteristic of this invention are set forth with particularity in the appended claims. The invention itself, however, both as to its organization and method of operation, as well as to additional objects and advantages thereof, can best be understood from the following description and read in conjunction with the accompanying drawings, in which:

FIGURE 1 is a schematic circuit diagram of a delay circuit embodying the invention;

FIGURE 2 is a series of graphs illustrating various pulses occurring at selected locations in the circuit diagram of FIGURE 1; and, FIGURES 3 through 6 are schematic circuit block diagrams and input and output waveforms of various circuit combinations which include a delay circuit embodying the invention in which the delay introduced by the entire circuit combination may be at the leading edge alone, the lagging edge alone, or both.

Referring now to FIGURE 1, a delay circuit 10 includes a pair of input terminals 12 and 13 across which a pulse generator 14 is connected. The input terminal 13 is connected to a point of reference potential, or ground, in the circuit 10 while the other input terminal 12 is coupled through a coupling resistor 15 to the anode of a diode 16. The cathode of the diode 16 is coupled to one terminal 17 of an integrating circuit 18, the other terminal 19 of which is grounded.

The integrating circuit 18 includes the series combination of a resistive element, such as a variable resistor 20, and a reactive storage element, such as a capacitor 22, connected in the order named between the terminals 17 and 19. The terminal 17 of the integrating circuit 18 is coupled through a resistor 23 to a source of negative potential, indicated as $(-V_1)$ in FIGURE 1. The delay circuit 10 also includes a first transistor 24 having an input base electrode 26, an output collector electrode 28 and a common emitter electrode 30. The first transistor 24 is of the NPN conductivity type. The input electrode 26 is coupled through the parallel combination of a resistor 32 and a capacitor 34 to the junction 36 of the resistor 20 and capacitor 22 in the integrating circuit 18. The output electrode 28 of the transistor 24 is coupled through a load resistor 37 to a source of positive potential, designated as $(+V_2)$ in FIGURE 1. The common electrode 30 of the transistor 24 is coupled to the junction of a pair of voltage dividing resistors 38 and 40. The voltage dividing resistors 38 and 40 are connected between a source of negative potential, indicated as $(-V_3)$ in FIGURE 1, and ground.

The delay circuit 10 also includes a second transistor 50 having base 52, emitter 54, and collector 56 electrodes. The second transistor 50 in a PNP transistor, and thus of opposite conductivity type to the first transistor 24. The emitter electrode 54 of the second transistor 50 is coupled to the junction of the resistor 20 and capacitor 22 of the integrating circuit 18. The base electrode 52 of the second transistor 50 is coupled to the anode of the diode 16 while the output collector electrode 56 is directly coupled to the source of negative potential $(-V_3)$. The second transistor 50 is utilized in the delay circuit 10 to provide a low impedance discharge path for the capacitor 22.

A third transistor 60, which functions as an inverter of the output pulse of the first transistor 24 is also included in the delay circuit 10. The third transistor 60 which is a PNP type transistor includes an input base electrode 62, a common emitter electrode 64 and an output collector electrode 66. The input base electrode 62 of the transistor 60 is coupled through the parallel combination of a resistor 68 and a capacitor 70 to the output collector electrode 28 of the first transistor 24. The input electrode 62 is also quiescently clamped to ground by the forward conduction of a diode 72 connected between this electrode and ground. The emitter electrode 64 of the third transistor 60 is coupled directly to ground, while the collector electrode 66 thereof is coupled through a load resistor 74 to the source of negative potential ($-V_3$). An output pulse is derived from a pair of output terminals 76 and 78. The output terminal 76 is coupled directly to the collector electrode 66 of the transistor 60 while the output terminal 78 is grounded.

The base-emitter junction of the first transistor 24 is reverse biased due to the greater absolute magnitude of negative potential developed at the base electrode 26, by the negative charging of the capacitor 22 from the source ($-V_1$), than the negative potential developed at the emitter electrode 30, by the voltage dividing resistors 38 and 40. Thus, the first transistor 24 is quiescently biased to cut-off. The second transistor 50 is similarly biased to cut-off by the negative charge developed on the capacitor 22 in the integrating circuit 18. The base electrode 62 of the third transistor 60 is clamped to ground by the forward conduction of the diode 72 while the emitter electrode 64 thereof is also grounded. Thus, the third transistor 60 is also quiescently biased to cut-off.

In operation, an input pulse from the pulse generator 14 as shown in line "*a*" of FIGURE 2 is applied to the input terminals 12 and 13. The positive-going input pulse, which increases from a negative potential level to zero potential level, causes the capacitor 22 to charge oppositely to its quiescent charge, along a path as shown in line "*b*" of FIGURE 2. The base electrode 26 voltage of the first transistor 24 follows the positive charging of the capacitor 22 and when the base 26 reaches a potential less negative than the potential at the junction of the voltage dividing resistors 38 and 40, the first transistor 24 is rendered conductive and rapidly saturates. The saturation of the transistor 24 causes the collector electrode 28 thereof to assume the negative potential of the emitter electrode 30. The pulse produced at the collector 28 of the first transistor 24 is shown in line "*c*" of FIGURE 2. The negative potential developed at the collector 28 of the first transistor 24 reverse biases the diode 72 and forward biases the emitter-base junction of the transistor 60. The transistor 60 is driven rapidly to saturation by the saturation of the transistor 24 and a positive-going output pulse is developed across the output terminals 76 and 78 as shown in line "*d*" in FIGURE 2.

At the termination of the input pulse, or the trailing edge thereof, the base electrode 52 of the second transistor 50 is returned to the negative potential level ($-V_3$). The more positive potential appearing at the junction of the integrating circuit 18, due to the charging of the capacitor 22, forward biases the emitter-base junction of the transistor 50 and drives this transistor to saturation. The low impedance path exhibited by the transistor 50 rapidly discharges the capacitor 22. The polarity of the diode 16 prevents feedback to the generator 14.

The discharge of the capacitor 22 cuts off the first transistor 24 which in turn cuts off the third transistor 60. At the conclusion of the discharge of the capacitor 22, the second transistor 50 is cut-off. Thus, the trailing edges of the input and output pulses substantially coincide. The rapid discharge of the capacitor 22 causes the pulse delay circuit 10 to exhibit a fast recovery time, permitting the circuit to be pulsed periodically at relatively short time intervals.

The leading edge of the output pulse is delayed in time with respect to the leading edge of the input pulse but the trailing edges of both pulses coincide, that is, they are within 40 nanoseconds at room temperature. The time delay introduced by the pulse delay circuit 10 is determined by the time constant of the integrating circuit 18 as well as the value of the resistor 15, in accordance with the time constant equation $$T=(R20+R15)C22$$

where

R20 equals the resistance value of the resistor 20.
R15 equals the resistance value of the resistor 15.
C22 equals the capacitance value of the capacitor 22.

A pulse delay circuit 10 which was constructed in accordance with the invention and which included the type and values of components, as shown in FIGURE 1, exhibited delays which varied from 50 to 380 nanoseconds depending on the setting of the variable resistor 20.

In FIGURES 3 through 6 are shown various logical applications of a pulse leading edge delay circuit in accordance with the invention. For convenience, identical components in these figures are given identical reference numerals. In FIGURE 3*a*, a pulse leading edge delay circuit 10, of the type shown in FIGURE 1, is combined with an inverter 80 and a NOR gate 82 to produce an output pulse, FIGURE 3*c*, in which the leading edge thereof coincides with the leading edge of an input pulse as shown in FIGURE 3*b*. However, the trailing edge of the output pulse occurs a predetermined time delay after the leading edge thereof.

Both the input terminals of the delay circuit 10 and the inverter 80 are coupled to an input terminal 84 of the pulse shaping circuit of FIGURE 3*a* while the output terminals of the delay circuit 10 and the inverter 80 are coupled to separate input terminals of the NOR gate 82. The inverter 80 operates to invert a low level input to produce a high level output and conversely inverts a high level input to provide a low level output. The low and high levels may, for example, represent binary values of "0" and "1" respectively. The NOR gate 82 is a positive NOR gate in which a high level output is produced at the output terminal 86 thereof when all the inputs to the NOR gate are at a low level. Additionally, the output of the NOR gate 82 is at a low level whenever one or more of the inputs thereto is at a high level. The low and high levels also may correspond respectively to binary values of "0" and "1."

In operation, the input pulse, shown in FIGURE 3*b*, is inverted in the inverter 80 to produce a low level output from the inverter 80. The application of the input pulse to the delay circuit 10 produces an output pulse therefrom with the leading edge delayed a predetermined time. Thus, during this predetermined time delay, both inputs to the NOR gate 82 are at a low level and the NOR gate 82 responds by producing a high level output. At the time the delay circuit 10 produces a high level output pulse, the NOR gate 82 is deactivated and the output therefrom drops to a low level. Thus, the combination of the delay circuit 10, the inverter 80 and the NOR gate 82 produce an output pulse having a leading edge which coincides with the leading edge of an input pulse but having a trailing edge which occurs a predetermined time after the leading edge thereof. The width of the output pulse may be varied by changing the time constant of the integrating circuit in the delay circuit 10.

Figure 4:
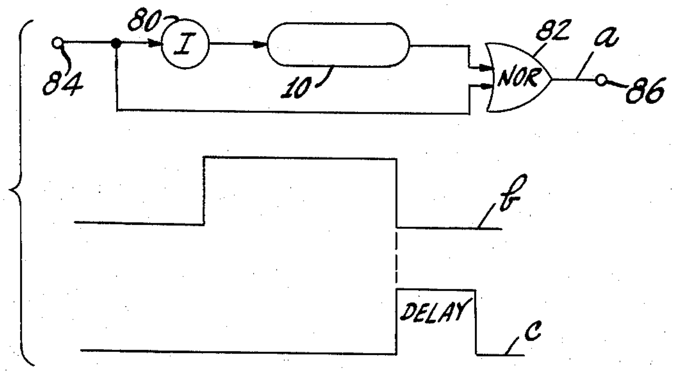

In FIGURE 4, the inverter 80, the delay circuit 10 and the NOR gate 82 are serially connected, in the order named, between the input terminal 84 and the output terminal 86 of the pulse shaping circuit. Additionally, the input terminal 84 is also directly coupled to one input terminal of the NOR gate 82. In this circuit configuration, an input pulse, shown in FIGURE 4*b*, produces an output pulse, FIGURE 4*c*, having a leading edge which occurs coincidently with the trailing edge of the input pulse and a trailing edge which occurs a predetermined time after the leading edge thereof. This predetermined time is equal to the delay introduced by the delay circuit 10.

In operation, the input pulse is applied directly to the NOR gate 82 and thus the NOR gate 82 is disabled until the termination of this pulse. The high level input pulse is also applied to and inverted by the inverter 80 producing a low level input to the delay circuit 10. The delay circuit will not respond to this low level input. At the termination of the input pulse, the inverter 80 output goes to a high level. However, the delay circuit 10 delays the production of a high output pulse for a predetermined time delay. During this time delay period, the NOR gate 82 has applied thereto two low level inputs and therefore responds by producing a high level output. At the end of the time delay period, the delay circuit 10 produces a high level output and the NOR gate 82 is deactivated. Thus, in the circuit of FIGURE *4a*, an output pulse is produced which has a leading edge which coincides with the trailing edge of an input pulse, while the trailing edge of the output pulse occurs at the end of time delay introduced by the delay circuit 10.

Figure 5:
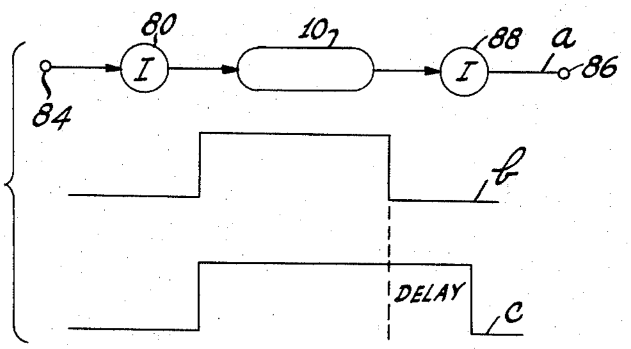

In FIGURE 5, a circuit is provided which produces an output pulse having a width which is elongated over that of an input by an amount equal to the time delay introduced by the delay circuit 10. In FIGURE *5a*, a first inverter 80, a delay circuit 10, and a second inverter 88 are serially coupled in the order named between the input 84 and output 86 terminals of the circuit. In operation, the inverter 80 inverts the input pulse to produce a low level output therefrom. The delay circuit 10 does not respond to this low level input and also produces a low level output. The second inverter 88 inverts the low level output from the delay circuit 10 to provide a high level output at the output terminal 86. At the termination of the input pulse, the output of the inverter 80 goes high but the delay circuit 10 does not produce a high level output until after the predetermined time delay introduced. Thus, the inverter 88 provides a high level output therefrom until the end of the predetermined time delay.

Figure 6:
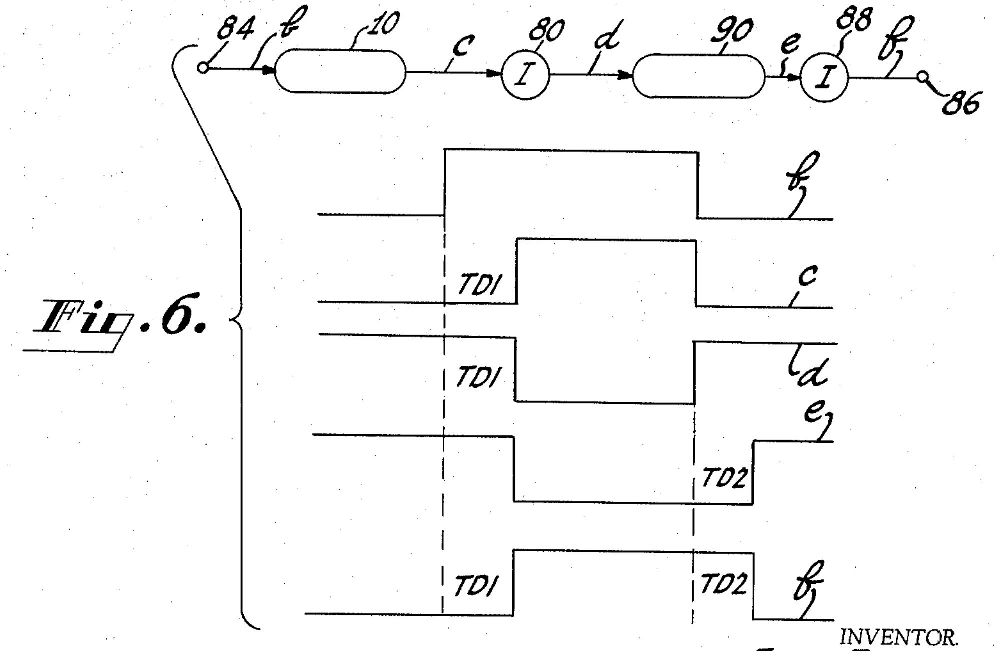

In FIGURE 6 is shown a circuit which permits both the leading and trailing edges of an output pulse to be delayed predetermined and different times from the leading and trailing edges, respectively, of an input pulse. A first pulse leading edge delay circuit 10, a first inverter 80, a second pulse leading edge delay circuit 90, and a second inverter 88 are coupled serially, in the order named, between the input 84 and the output 86 terminals of the circuit.

FIGURES *6b* through *6f* show the waveforms appearing at the various points *b* through *f* in the circuit. The time delays $TD_1$ and $TD_2$ are determined by the delay circuits 10 and 90 respectively and each may be varied separately by changing the respective time constants in the delay circuits 10 and 90.

It is apparent that various other pulse shaping circuits may be provided in accordance with the procedures utilized in the pulse shaping circuits of FIGURES 3 through 6.

What is claimed is:

1. A delay circuit comprising the combination of
an integrating circuit including the series combination of a resistive element and a reactive storage element,
a first transistor of one conductivity type having input and common electrodes coupled across said reactive storage element, and an output electrode,
biasing means connected across said integrating circuit to charge said reactive storage element in one direction to quiescently bias said first transistor to cut off,
means for applying an input pulse to said integrating circuit of a polarity to charge said reactive storage element in a direction opposite to said one direction so as to turn on said first transistor after a predetermined time delay,
a second transistor of opposite conductivity type to said first transistor coupled to said integrating circuit in a manner to discharge said reactive storage element and turn off said first transistor at the termination of said input pulse, and
means coupled to the output electrode of said first transistor for deriving an output pulse having a leading edge delayed said predetermined time with respect to the leading edge of said input pulse but a trailing edge substantially coinciding with the trailing edge of said input pulse.

2. A delay circuit in accordance with claim 1, wherein said reactive storage element comprises a capacitor.

3. A delay circuit comprising the combination of
an integrating circuit including the series combination of a resistor and a capacitor,
a first transistor of one conductivity type and having emitter, base and collector electrodes,
means coupling said capacitor between the base and emitter electrodes of said first transistor,
a second transistor of opposite conductivity type to said first transistor and having emitter, base and collector electrodes,
means coupling said resistor between the base and emitter electrodes of said second transistor and said capacitor between the emitter and collector electrodes of said second transistor,
biasing means connected across said integrating circuit for charging said capacitor in a direction to quiescently bias said first and second transistors to cut off,
means for applying an input pulse to said integrating circuit to charge said capacitor in a direction to turn on and saturate said first transistor after a predetermined time delay,
means including said second transistor for providing a low impedance path to discharge said capacitor and turn off said first transistor at the termination of said input pulse, and
means including a third transistor of opposite conductivity type to said first transistor and including base, emitter, and collector electrodes, means for coupling said base and emitter electrodes of said third transistor to said collector and emitter electrodes, respectively, of said first transistor, and, means for deriving from between said emitter and collector electrodes of said third transistor an output pulse having a leading edge delayed said predetermined time from the leading edge of said input pulse but a trailing edge substantially coinciding with the trailing edge of said input pulse.

4. A delay circuit in accordance with claim 3, wherein said resistor is variable to vary said predetermined time delay.

5. A pulse shaping circuit having an input terminal and an output terminal comprising in combination
an inverter coupled to said input terminal,
a pulse leading edge delay circuit serially connected to said inverter,
a NOR gate having a first input terminal serially connected to said pulse leading edge delay circuit, an output terminal coupled to the output terminal of said pulse shaping circuit, and a second input terminal, and
means coupling said second input terminal of said NOR gate to the input terminal of said pulse shaping circuit.

6. A pulse shaping circuit having an input terminal and an output terminal, comprising in combination
a first inverter,
a pulse leading edge delay circuit,
a second inverter, and
means for serially connecting said first inverter, said delay circuit and said second inverter, in the order named, between said input and output terminals.

7. A pulse shaping circuit having an input terminal and an output terminal, comprising in combination a first pulse leading edge delay circuit,
a first inverter,
a second pulse leading edge delay circuit,
a second inverter, and
means serially connecting said first delay circuit, said first inverter, said second delay circuit, said second inverter, in the order named, between said input and output terminals.

References Cited by the Examiner

UNITED STATES PATENTS

| | | | |
|---|---|---|---|
| 2,892,101 | 6/1959 | Bright | 307—88.5 |
| 3,028,552 | 4/1962 | Hahs | 328—55 |
| 3,073,972 | 1/1963 | Jenkins | 307—88.5 |
| 3,139,535 | 6/1964 | Saito | 307—88.5–6 |

DAVID J. GALVIN, *Primary Examiner.*

ARTHUR GAUSS, *Examiner.*